(12) United States Patent
Suzuki

(10) Patent No.: US 7,301,383 B2
(45) Date of Patent: Nov. 27, 2007

(54) CIRCUIT FOR CONTROLLING PHASE WITH IMPROVED LINEARITY OF PHASE CHANGE

(75) Inventor: Kouichi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 134 days.

(21) Appl. No.: 11/209,518

(22) Filed: Aug. 24, 2005

(65) Prior Publication Data

US 2006/0208784 A1 Sep. 21, 2006

(30) Foreign Application Priority Data

Mar. 17, 2005 (JP) ............................. 2005-078002

(51) Int. Cl.
*H03H 11/16* (2006.01)
(52) U.S. Cl. ...................... 327/237; 327/231
(58) Field of Classification Search ................ None
See application file for complete search history.

(56) References Cited

U.S. PATENT DOCUMENTS

| | | | | |
|---|---|---|---|---|
| 5,327,386 A | * | 7/1994 | Fudeyasu | ................... 365/221 |
| 5,945,860 A | * | 8/1999 | Guay et al. | ................... 327/246 |
| 6,472,921 B1 | * | 10/2002 | Rao et al. | ................... 327/237 |
| 6,539,072 B1 | * | 3/2003 | Donnelly et al. | ........... 375/371 |
| 7,135,905 B2 | * | 11/2006 | Teo et al. | ................... 327/231 |
| 7,180,352 B2 | * | 2/2007 | Mooney et al. | ............. 327/237 |
| 2002/0031032 A1 | * | 3/2002 | Ooishi | ......................... 365/226 |
| 2002/0070783 A1 | * | 6/2002 | Saeki | ......................... 327/235 |
| 2002/0196889 A1 | | 12/2002 | Tamura et al. | |
| 2004/0052323 A1 | * | 3/2004 | Zhang | ......................... 375/375 |

FOREIGN PATENT DOCUMENTS

JP 2003-8555 1/2003

* cited by examiner

*Primary Examiner*—Cassandra Cox
(74) *Attorney, Agent, or Firm*—Arent Fox LLP

(57) ABSTRACT

A circuit for controlling phase includes a first node providing a current responsive to a first clock signal, a first plurality of switch circuits coupled to the first node, a first plurality of current supply sources coupled to the first plurality of switch circuits, respectively, a second node providing a current responsive to a second clock signal, a second plurality of switch circuits coupled to the second node, and a second plurality of current supply sources coupled to the second plurality of switch circuits, respectively, wherein the first node and the second node are coupled to combine the first clock signal and the second clock signal, at least one of the first plurality of current supply sources having a current supply amount different from another, and at least one of the second plurality of current supply sources having a current supply amount different from another.

9 Claims, 5 Drawing Sheets

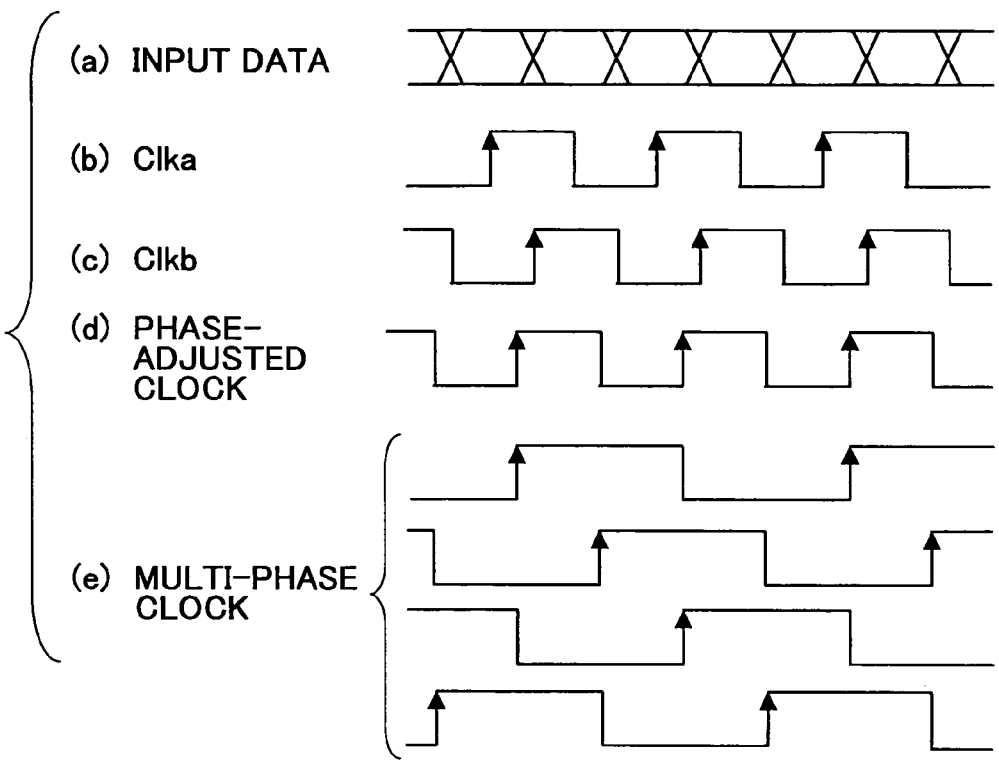
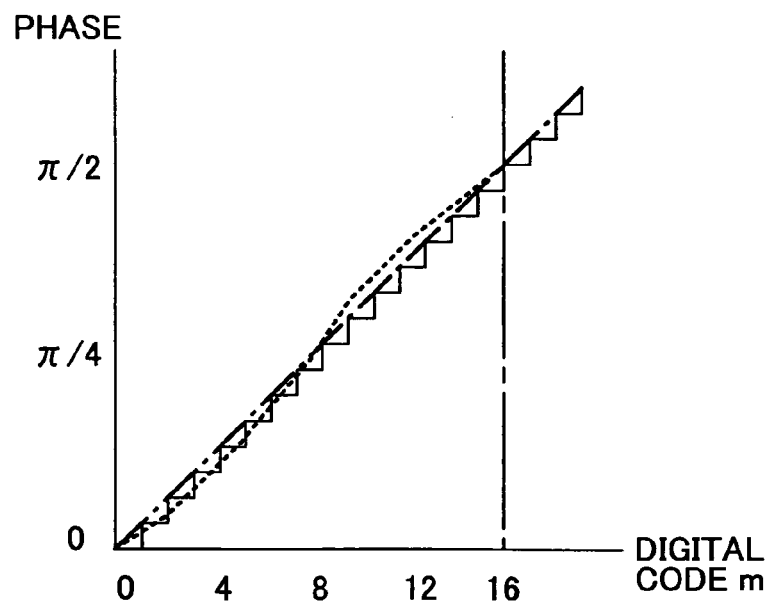

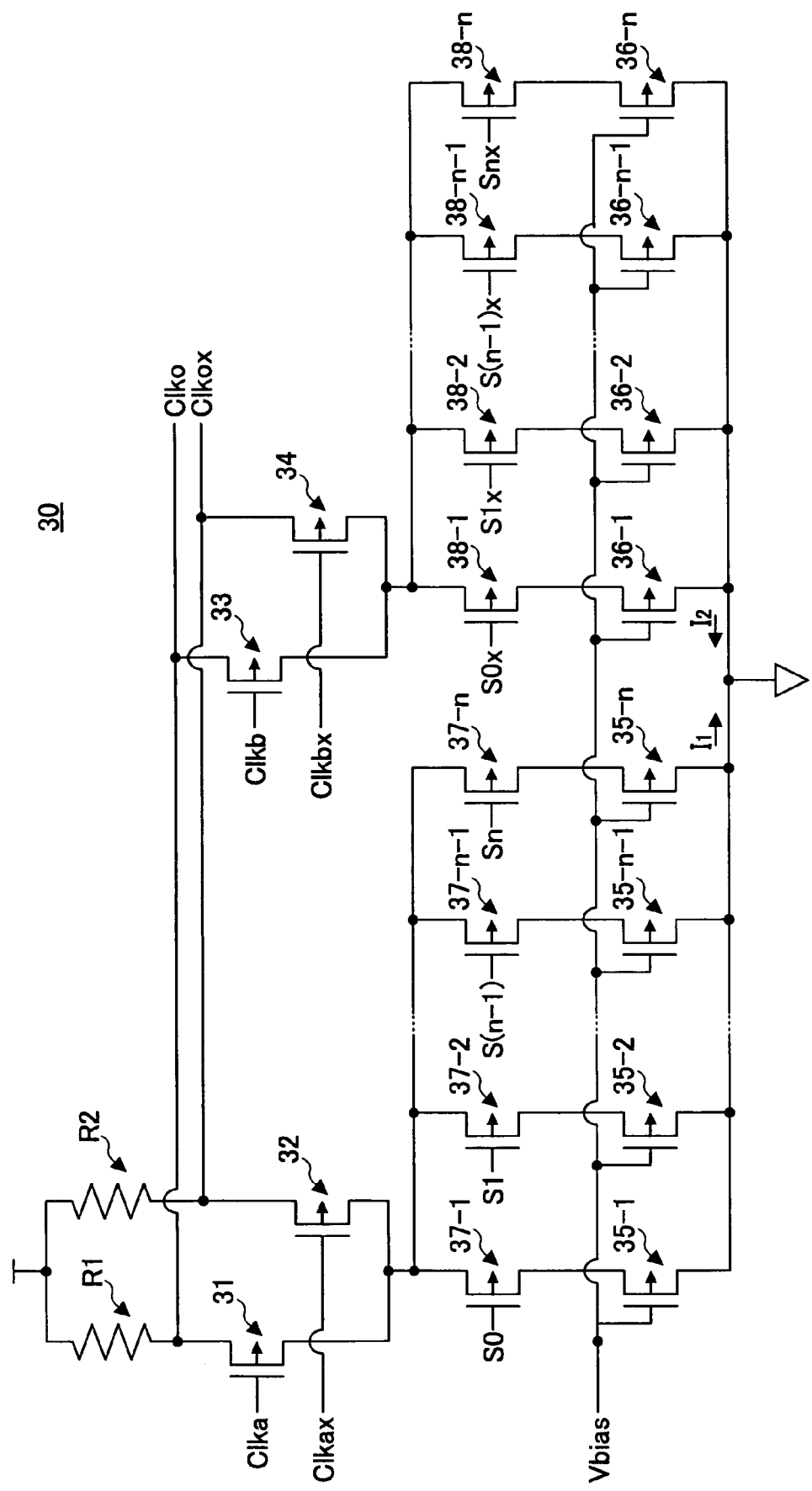

US 7,301,383 B2

CIRCUIT FOR CONTROLLING PHASE WITH IMPROVED LINEARITY OF PHASE CHANGE

CROSS-REFERENCE TO RELATED APPLICATIONS

The present application is based upon and claims the benefit of priority from the prior Japanese Patent Application No. 2005-078002 filed on Mar. 17, 2005, with the Japanese Patent Office, the entire contents of which are incorporated herein by reference.

BACKGROUND OF THE INVENTION

1. Field of the Invention

The present invention generally relates to circuits for controlling the phase of signals, and particularly relates to a phase control circuit which generates a clock signal having a desired phase by combining a plurality of clock signals.

2. Description of the Related Art

In order to improve system performance, not only the speed of individual components such as processors and memories need to be enhanced, but also the speed of signal transmission between the individual components, i.e., chips, needs to be enhanced. In order to increase the speed of signal transmission, the circuits that receive signals need to operate at accurate timing relative to the signals.

In high-speed serial communications, provision is made to avoid transmitting a clock signal as a separate signal from the communication data in order to reduce the number of communication lines. In order to correctly receive communication data transmitted from the transmission side, the data receiver unit recovers a clock signal based on the data stream of the received communication data, and recovers the data by latching the data in synchronization with the recovered clock signal. A circuit that recovers a clock signal and data signal in this manner is referred to as a clock and data recovery circuit.

FIG. 1 is a block diagram showing the configuration of a related-art receiver using a clock and data recovery circuit. A receiver 10 of FIG. 1 includes an amplifier 11, a sampler 12, a demultiplexer 13, a digital filter 14, and a multi-phase clock generator 15.

The amplifier 11 receives data transmitted from the transmission side, and amplifies the received data. The received data amplified by the amplifier 11 is supplied to the sampler 12. The sampler 12 samples the received data supplied from the amplifier 11 in synchronization with a plurality of clock signals (multi-phase clock signals) having the same frequency and different phases, which are supplied from the multi-phase clock generator 15. The example shown in FIG. 1 illustrates a case in which the received data is multiplexed data. The data that are sampled at different phases by the sampler 12 are demultiplexed by the demultiplexer 13.

The data sampled at different phases in the manner as described above have values responsive to the phase of the respective multi-phase clock signals generated by the multi-phase clock generator 15. The digital filter 14 performs filtering on the sampled data, thereby generating a digital code responsive to the timing relationships between the received data signal and the multi-phase clock signals generated by the multi-phase clock generator 15.

The multi-phase clock generator 15 receives an internal clock signal, and generates the plurality of clock signals having the same frequency and different phases based on the internal clock signal. In so doing, the multi-phase clock generator 15 adjusts the phase of the clock signals in response to the digital code supplied from the digital filter 14. This makes it possible to latch the data by using clock signals having the timings that match the received data.

FIG. 2 is a drawing showing an example of the configuration of the multi-phase clock generator 15. The multi-phase clock generator 15 of FIG. 2 includes a multi-phase clock generating unit 21, a phase controlling circuit 22, and a delay element line 23.

The multi-phase clock generating unit 21 uses an internal clock signal Clk as an input signal, and, based thereupon, generates k signals having different phases by use of a series of delay elements each having a delay of T/k relative to a clock cycle T as shown in FIG. 2. In order to divide one cycle exactly by k, PLL (phase locked loop) or DLL (delay locked loop) may be used.

The phase controlling circuit 22 adds up the multi-phase clock signals generated by the multi-phase clock generating unit 21 to obtain a weighted sum by assigning different weighting factors, thereby generating a clock signal having the phase indicated by the input digital code. The phase controlling circuit 22 may be implemented by use of a mixer circuit, for example. A mixer circuit may obtain a weighed sum of a sinusoidal wave having 0-degree phase and another sinusoidal wave having 90-degree phase by assigning different weighting factors (different amplitudes), thereby generating a sinusoidal wave having a desired phase between 0 degree and 90 degrees.

The clock signal having a desired phase generated by the phase controlling circuit 22 is supplied to the delay element line 23. The delay element line 23 uses the phase-adjusted clock signal supplied from the phase controlling circuit 22 as an input signal, and, based thereupon, generates 1 signals having different phases by use of a series of delay elements each having a delay of T/1 relative to the clock cycle T.

FIG. 3 is a signal waveform diagram showing the process by which multi-phase clock signals are generated. FIG. 3-(a) illustrates input data. A clock signal Clka having a 0-degree phase as shown in (b) and a clock signal Clkb having a 90-degree phase as shown in (c) are supplied to the phase controlling circuit 22 shown in FIG. 2. The phase controlling circuit 22 combines the clock signal Clka and the clock signal Clkb to generate a clock signal having a desired phase between 0 degree and 90 degrees. The clock signal having a desired phase generated in this manner is illustrated as a phase-adjusted clock signal in (d).

Based on the phase-adjusted clock signal shown in (d), multi-phase clock signals shown in (e) are generated. In this example, four multi-phase clock signals having respective phases of 0 degree, 90 degrees, 180 degrees, and 270 degrees are generated. These multi-phase clock signals are supplied to the sampler 12 (FIG. 1), which samples the input data by use of the individual clock signals.

In the configuration that uses a mixer circuit as the phase controlling circuit 22, the mixer circuit operates as will be described in the following. When the input clock signals are sinusoidal waves, the clock signal Clka having a 0-degree phase and the clock signal Clkb having a 90-degree phase are represented as:

$Clka = A \sin(t)$ $Clkb = B \sin(t - \pi/2)$

Here, the amplitude of the clock signal Clka is A, and the amplitude of the clock signal Clkb is B. The mixer circuit adds up a plurality of sinusoidal wave electric signals to generate a single sinusoidal wave signal. When the clock signal Clka and the clock signal Clkb are added together, the following is obtained.

$$Clka + Clkb = (A^2 + B^2)^{1/2} \sin(t - \phi) \quad (1)$$

$$\phi = \tan^{-1}(B/A) \quad (2)$$

In conventional mixer circuits, a reference current Ir is used, and the amplitude A is set to (Ir) (1−m/n), and the amplitude B is set to (Ir) (m/n). Namely, the amplitude A and the amplitude B are represented by a function that respectively decreases and increases linearly in response to m with a step size of an amplitude change being Ir/n. As m is increased one by one from zero to n, the amplitude A linearly decreases, and the amplitude B linearly increases. This makes it possible to increase the phase gradually from 0 degree to 90 degrees. This value m corresponds to the above-described digital code.

In the conventional mixer circuit as described above, the amplitude A and the amplitude B of the input sinusoidal waves are linearly changed. In this case, phase φ defined by the formula (2) does not change linearly.

FIG. 4 is a drawing showing phase values corresponding to respective digital codes. In FIG. 4, an interval from phase 0 to phase π/2 is assigned to the range of digital codes from 0 to 16, and the value of a phase represented by the formula (2) corresponding to each digital code is plotted. The illustrated stepwise characteristic line indicates an ideal situation in which the phase changes linearly in a stepwise manner in response to stepwise changes of the digital code. A chain line demonstrates an ideal situation in which the phase changes linearly as the step size of the digital code is further reduced.

In reality, phase φ defined by the formula (2) exhibits an S-shape curve characteristic as indicated by the dotted curved line. Namely, the rate of phase change relative to a change in the digital code becomes maximum around the center (π/4 in this example) of the range of phase change. Near the ends of the range of phase change (near 0 and near π/2), the rate of phase change relative to a change in the digital code becomes minimum. Namely, when A changes from 9/16 to 7/16, and B changes from 8/16 to 9/16, for example, a change in phase φ is relatively large. However, when A changes from 16/16 to 15/16, and B changes from 0/16 to 1/16, for example, a change in phase φ is relatively small. This may be intuitively understood by illustrating a sum of two phasors at a right angle to each other having amplitude A and amplitude B in the complex plane.

As described above, the size of phase change relative to a change in the digital code is not constant, and differs depending on what the current phase is. If the size of change is sometimes large and sometime small, the jitter of the clock signal becomes large when the size of change is large. Namely, if the digital code fluctuates due to process variation, noise, or the like, the phase of the phase-adjusted clock signal generated by the phase controlling circuit 22 fluctuates (suffers the occurrence of jitter). Depending on the position of the phase, the size of jitter can become larger than an ideal phase step size of the clock signal, which may cause error in the clock recovery operation and data recovery operation.

[Patent Document 1] Japanese Patent Application Publication No. 2003-8555.

Accordingly, there is a need for a phase controlling circuit in which the linearity of phase change relative to the digital code is improved.

SUMMARY OF THE INVENTION

It is a general object of the present invention to provide a phase controlling circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a phase controlling circuit particularly pointed out in the specification in such full, clear, concise, and exact terms as to enable a person having ordinary skill in the art to practice the invention.

To achieve these and other advantages in accordance with the purpose of the invention, the invention provides a circuit for controlling phase, which includes a first node operative to provide a flow of a current responsive to a first clock signal, a first plurality of switch circuits coupled to the first node, a first plurality of current supply sources coupled to the first plurality of switch circuits, respectively, a second node operative to provide a flow of a current responsive to a second clock signal, a second plurality of switch circuits coupled to the second node, and a second plurality of current supply sources coupled to the second plurality of switch circuits, respectively, wherein the first node and the second node are coupled to each other such as to combine the first clock signal and the second clock signal, at least one of the first plurality of current supply sources having a current supply amount different from a current supply amount of another one of the first plurality of current supply sources, and at least one of the second plurality of current supply sources having a current supply amount different from a current supply amount of another one of the second plurality of current supply sources.

According to at least one embodiment of the present invention, the plurality of current supply sources provided in a mixer circuit are configured to have individually specific current supply amounts. When the phase of the output clock signal is changed in response to a change in the opening and closing of the switch circuits, thus, the amount of a change of the clock signal current responsive to the status change of the switch circuits can be set to a desired amount. This makes it possible to set the amount of phase change of the output clock signal to a desired amount. It is thus possible to improve the linearity of phase change responding to the changes of a digital code, compared with the case of the related art, thereby achieving a constant phase change independent of what the value of the phase is.

BRIEF DESCRIPTION OF THE DRAWINGS

Other objects and further features of the present invention will be apparent from the following detailed description when read in conjunction with the accompanying drawings, in which:

FIG. 3 is a signal waveform diagram showing the process by which multi-phase clock signals are generated;

FIG. 4 is a drawing showing phase values corresponding to respective digital codes;

FIG. 5 is a drawing showing an example of the configuration of a phase controlling circuit according to the present invention;

DESCRIPTION OF THE PREFERRED EMBODIMENTS

Figure 1:
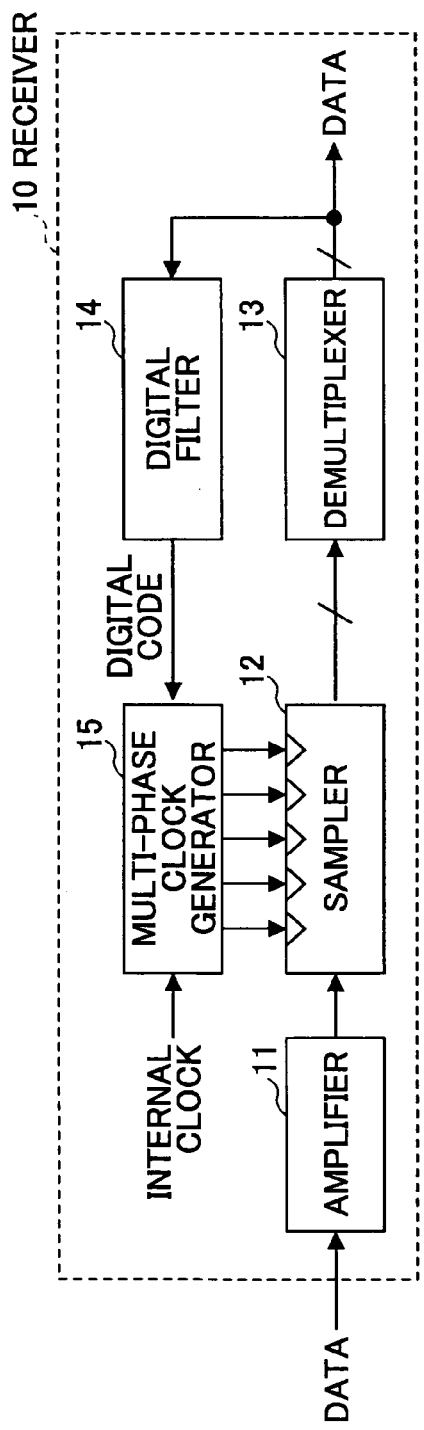
FIG. 1 is a block diagram showing the configuration of a related-art receiver using a clock and data recovery circuit.

In the following, embodiments of the present invention will be described with reference to the accompanying drawings.

FIG. 5 is a drawing showing an example of the configuration of a phase controlling circuit according to the present invention.

A phase controlling circuit 30 of FIG. 5 includes NMOS transistors 31 through 34, current supply sources 35-1 through 35-n, current supply sources 36-1 through 36-n, switches 37-1 through 37-n, switches 38-1 through 38-n, and resistors R1 and R2.

The gate node of the NMOS transistor 31 receives a sinusoidal wave signal Clka, and the gate node of the NMOS transistor 32 receives a sinusoidal wave signal Clkax. The gate node of the NMOS transistor 33 receives a sinusoidal wave signal Clkb, and the gate node of the NMOS transistor 34 receives a sinusoidal wave signal Clkbx. The signal Clka is a clock signal having a 0-degree phase serving as a reference phase. The signal Clkax is complementary to the signal Clka, and has a 180-degree phase. The signal Clkb is a clock signal having a 90-degree phase. The signal Clkbx is complementary to the signal Clkb, and has a 270-degree phase.

The signal Clka having a 0-degree phase and the signal Clkb having a 90-degree phase are added together with respective weights, thereby generating an output signal Clko. Further, the signal Clkax having a 180-degree phase and the signal Clkbx having a 270-degree phase are added together with respective weights, thereby generating an output signal Clkox, which is complementary to the output signal Clko.

The weighting factor of the 0-degree-phase signal Clka is substantially proportional to the amount of a current I1 flowing through the current supply sources 35-1 through 35-n. Further, the weighting factor of the 90-degree-phase signal Clkb is substantially proportional to the amount of a current I2 flowing through the current supply sources 36-1 through 36-n. Accordingly, the output signal Clko becomes a sinusoidal wave having a phase responsive to the ratio of the current amount I1 to the current amount I2. The output signal Clkox that is complementary to the output signal Clko is generated in the same manner.

The switches 37-1 through 37-n are implemented by use of NMOS transistors, the gate nodes of which receive digital signals S0 through Sn, respectively. Further, the switches 38-1 through 38-n are implemented by use of NMOS transistors, the gate nodes of which receive digital signals S0x through Snx, respectively. Here, the digital signals S0x through Snx are complementary to the digital signals S0 through Sn, respectively.

In response to the digital signals S0 through Sn, a desired number of switches among the switches 37-1 through 37-n are made conductive. With this provision, it is possible to couple a desired number of current supply sources among the current supply sources 35-1 through 35-n having individually specific current amounts to the NMOS transistors 31 and 32, thereby providing the signals Clka and Clkax with the weighting factor responsive to this desired number.

By the same token, in response to the digital signals S0x through Snx, a desired number of switches among the switches 38-1 through 38-n are made conductive. With this provision, it is possible to couple a desired number of current supply sources among the current supply sources 36-1 through 36-n having individually specific current amounts to the NMOS transistors 33 and 34, thereby providing the signals Clkb and Clkbx with the weighting factor responsive to this desired number.

Specifically, the m lower-order signals S0 through Sm among the digital signals S0 through Sn are set to "0", thereby making the m lower-order switches 37-1 through 37-m nonconductive. At this time, the remaining switches 37-m+1 through 37-n are conductive. Further, the m lower-order signals S0x through Smx among the digital signals S0x through Snx are set to "1", thereby making the m lower-order switches 38-1 through 38-m conductive. At this time, the remaining switches 38-m+1 through 38-n are nonconductive.

A change in the value m corresponds to a change in the digital code previously described. Namely, as m is increased one by one from zero to n, the amplitude of the clock signal Clka decreases, and the amplitude of the clock signal Clkb increases. This results in gradual phase increases from 0 degree to 90 degrees.

Figure 2:
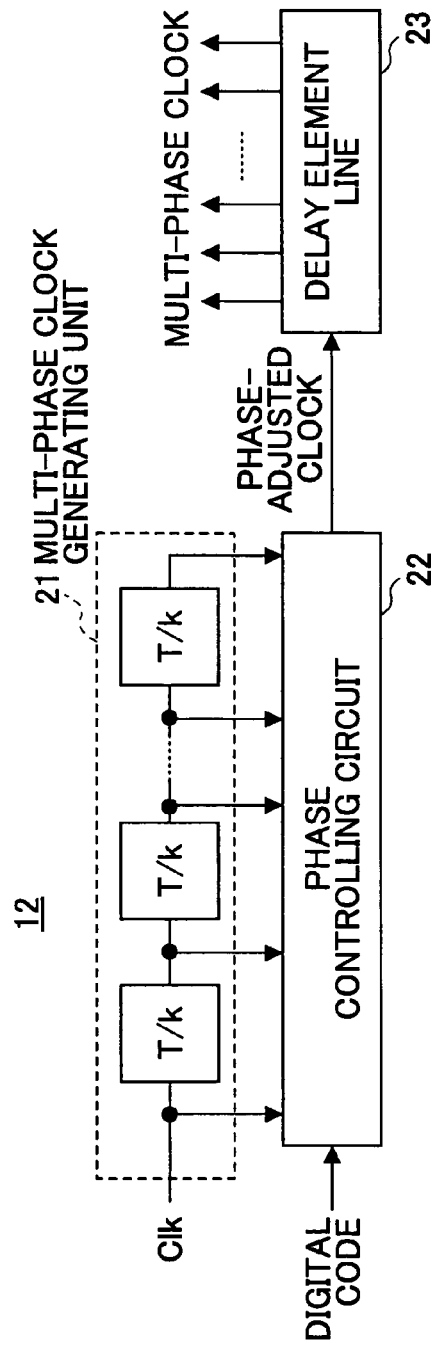
FIG. 2 is a drawing showing an example of the configuration of a multi-phase clock generator.

The phase controlling circuit 30 according to the present invention shown in FIG. 5 has the same circuit configuration as the related-art phase controlling circuit 22 described in connection with FIG. 2 as far as the circuit configuration is concerned. In the related-art phase controlling circuit 22, however, the respective current amounts of the plurality of current supply sources are equal to each other. In the phase controlling circuit 30 of the present invention, on the other hand, the current supply sources 35-1 through 35-n and the current supply sources 36-1 through 36-n have individually specific current amounts. This may be achieved by selecting individually specific size for each of the gate widths W of the NMOS transistors forming the current supply sources 35-1 through 35-n and the current supply sources 36-1 through 36-n. The current amounts of the current supply sources 35-1 through 35-n may differ from each other, but each and every one of them differing from one another is not an essentially required condition.

The current amounts of the current supply sources 35-1 through 35-n corresponding to the switches 37-1 through 37-n are denoted as IS0 through ISn, respectively. The current amounts of the current supply sources 36-1 through 36-n corresponding to the switches 38-1 through 38-n are denoted as IS0x through ISnx, respectively. In the first embodiment of the present invention, the current supply sources are provided such as to satisfy the following conditions with respect to the individual current amounts.

$$IS0 > IS1 > \ldots > IS(n/2) < \ldots < IS(n-1) < ISn$$

$$IS0x > IS1x > \ldots > IS(n/2)x < \ldots < IS(n-1)x < ISnx$$

Figure 6:
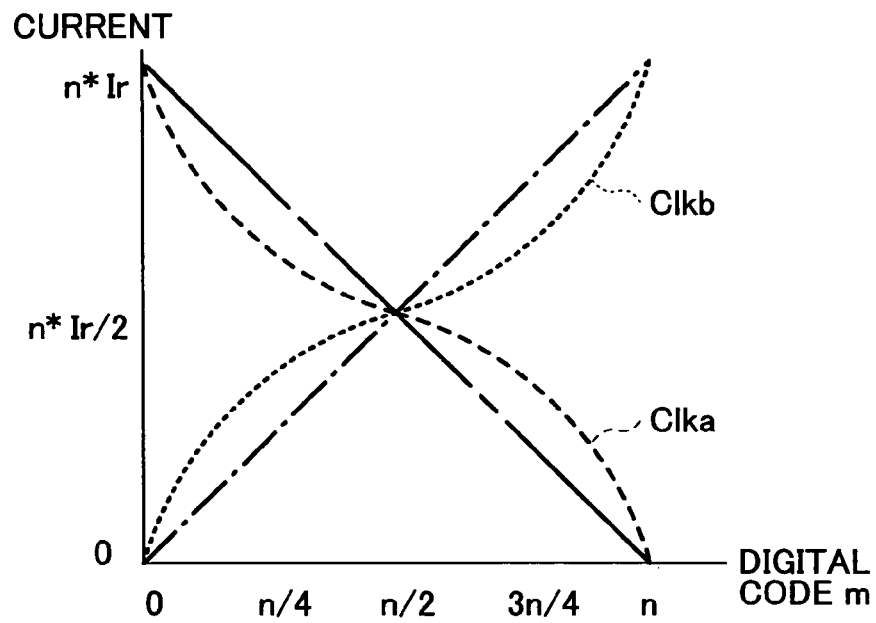
FIG. 6 is a drawing showing the current amounts of individual clock signals corresponding to various digital codes in the configuration of the present invention.

FIG. 6 is a drawing showing the current amounts of the individual clock signals corresponding to various digital codes in the configuration of the present invention. As shown in FIG. 6, the current amount of the clock signal Clka illustrated by a dashed curved line decreases from n·Ir (Ir: an average of the current amounts of the current supply sources) as the digital code m increases. A rate of decrease, i.e., a change in the current amount in response to a one-step change of the digital code m, is set smaller than the amount of a related-art linear current change around the center (n/2) of the range of phase change. Accordingly, a phase change in response to a digital code change is suppressed compared with that of the related-art. Further, near the ends (0 and n) of the range of phase change, a change in the current amount in response to a one-step change of the digital code m is set larger than the amount of a related-art linear current change. Accordingly, a phase change in response to a digital code change is enhanced compared with that of the related-art.

The current amount of the clock signal Clkb illustrated by a dotted curved line increases from zero as the digital code m increases. A rate of increase, i.e., a change in the current amount in response to a one-step change of the digital code m, is set smaller than the amount of a related-art linear current change around the center (n/2) of the range of phase change. Accordingly, a phase change in response to a digital code change is suppressed compared with that of the related-art. Further, near the ends (0 and n) of the range of phase change, a change in the current amount in response to a one-step change of the digital code m is set larger than the amount of a related-art linear current change. Accordingly, a phase change in response to a digital code change is enhanced compared with that of the related-art.

Figure 7:
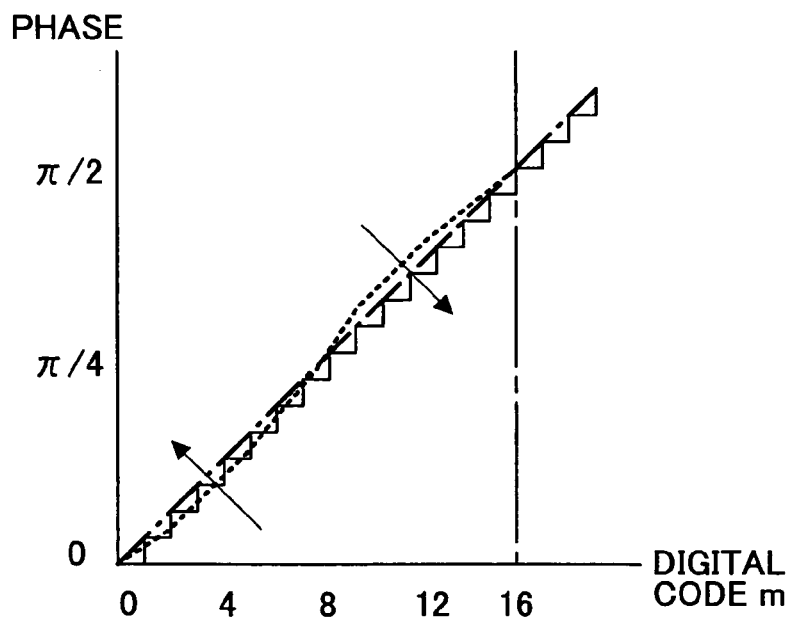
FIG. 7 is a drawing showing phases corresponding to various digital codes.

FIG. 7 is a drawing showing phases corresponding to various digital codes. In FIG. 7, an interval from phase 0 to phase $\pi/2$ is assigned to the range of digital codes from 0 to 16. The illustrated stepwise characteristic lines indicate an ideal situation in which a phase changes linearly in a stepwise manner in response to the stepwise changes of the digital code. A chain line demonstrates an ideal situation in which the phase changes linearly as the step size of the digital code is further reduced.

In the related-art configuration, phase $\phi$ exhibits an S-shape curve characteristic as indicated by the dotted curved line. Namely, the rate of phase change relative to a change in the digital code becomes maximum around the center ($\pi/4$ in this example) of the range of phase change. Near the ends of the range of phase change (near 0 and near $\pi/2$), the rate of phase change relative to a change in the digital code becomes minimum.

In the present invention, as previously described, a change in the current amount in response to a one-step change of the digital code m is set smaller than the amount of the related-art current change around the center ($\pi/4$) of the range of phase change. Accordingly, correction is applied such that the slope of the S-shape curve illustrated by the dotted curved line is made smaller around the center. Further, near the ends (0 and $\pi/2$) of the range of phase change, a change in the current amount in response to a one-step change of the digital code m is set larger than the amount of the related-art current change. Accordingly, correction is applied such that the slope of the S-shape curve illustrated by the dotted curved line is made larger around the ends.

Because of the corrections applied to the S-shape curve characteristic illustrated by the dotted curved line, the S-shape curve is bent as indicated by arrows in FIG. 7 in the present invention, so that the curve approaches the ideal characteristic (chain line) in which the phase changes linearly. It is thus possible to improve the linearity of phase change responding to the changes of the digital code, compared with the case of the related art, thereby achieving a constant phase change independent of what the value of the current phase is.

In the first embodiment of the present invention described above, the current supply source corresponding to the center of the range of phase change is set to the smallest current amount. In a second embodiment which will be described in the following, a current supply source corresponding to one end of the range of phase change is set to the smallest current amount, and the current supply source corresponding to the other end is set to the largest current amount.

The current amounts of the current supply sources 35-1 through 35-n corresponding to the switches 37-1 through 37-n are denoted as IS0 through ISn, respectively. The current amounts of the current supply sources 36-1 through 36-n corresponding to the switches 38-1 through 38-n. are denoted as IS0x through ISnx, respectively. In the second embodiment of the present invention, the current supply sources are provided such as to satisfy the following conditions with respect to the individual current amounts.

$$IS0 < IS1 < \ldots < IS(n/2) < \ldots < IS(n-1) < ISn$$

$$IS0x > IS1x > \ldots > IS(n/2)x > \ldots > IS(n-1)x > ISnx$$

Figure 8:
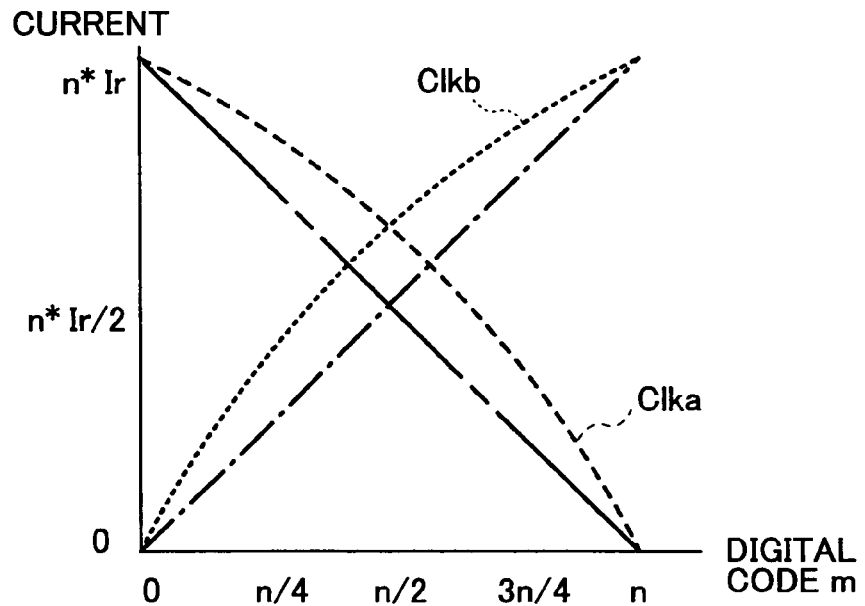
FIG. 8 is a drawing showing the current amounts of individual clock signals corresponding to various digital codes in the configuration of the present invention.

FIG. 8 is a drawing showing the current amounts of the individual clock signals corresponding to various digital codes in the configuration of the present invention. As shown in FIG. 8, the current amount of the clock signal Clka illustrated by a dashed curved line decreases from ne·r (Ir: an average of the current amounts of the current supply sources) as the digital code m increases. A rate of decrease, i.e., a change in the current amount in response to a one-step change of the digital code m, is smallest at the point where m is 0, and increases with an increase in m.

The current amount of the clock signal Clkb illustrated by a dotted curved line increases from zero as the digital code m increases. A rate of increase, i.e., a change in the current amount in response to a one-step change of the digital code m, is largest at the point where m is zero, and decreases with an increase in m.

Figure 9:
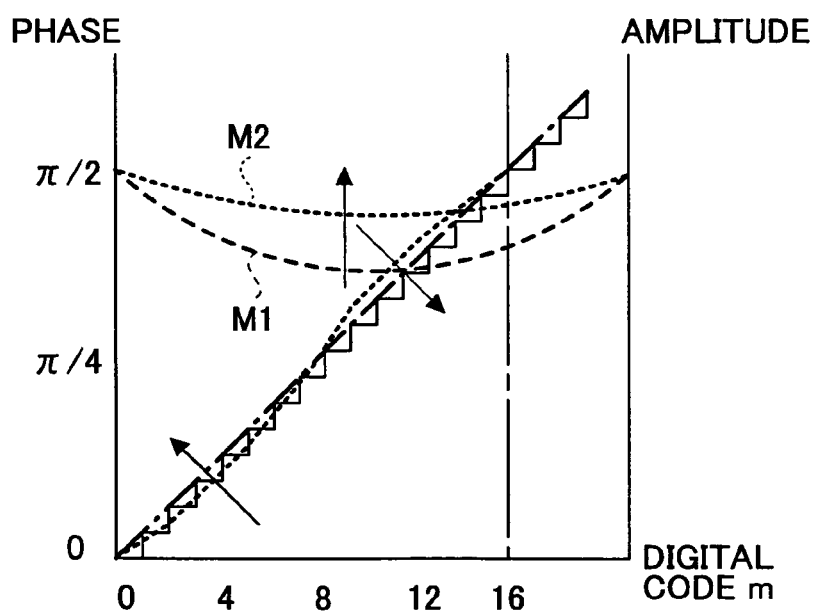
FIG. 9 is a drawing showing phases corresponding to various digital codes.

FIG. 9 is a drawing showing phases corresponding to various digital codes. In FIG. 9, an interval from phase 0 to phase $\pi/2$ is assigned to the range of digital codes from 0 to 16.

In the related-art configuration, phase $\phi$ exhibits an S-shape curve characteristic as indicated by the dotted curved line. Similarly to the case of the first embodiment shown in FIG. 7, the S-shape curve is bent as indicated by arrows shown in FIG. 9 in the second embodiment, so that the curve approaches the ideal characteristic (chain line) in which the phase changes linearly. It is thus possible to improve the linearity of phase change responding to the changes of the digital code, compared with the case of the related art, thereby achieving a constant phase change independent of what the current phase is.

In the second embodiment, further, the amplitude $(A^2 + B^2)^{1/2}$ of the phase-adjusted signal is closer to a constant value than is the amplitude of the first embodiment. In FIG. 9, M1 is the amplitude of the phase-adjusted signal in the case of the first embodiment, and M2 is the amplitude of the phase-adjusted signal in the case of the second embodiment. As shown in FIG. 9, the amplitude significantly drops near the center in the first embodiment, whereas such a drop is reduced in the case of the second embodiment.

The reason of such improvement can be understood from FIG. 8. Around the center (n/2) of the range of phase change, the amplitude A (current amount) of the clock signal Clka and the amplitude B (current amount) of the clock signal Clkb are larger than Ir·(n/2). In the case of the related-art configuration or first embodiment, the amplitude A and amplitude B at this position is equal to Ir·(n/2). In the second embodiment, therefore, the value of the amplitude $(A^2+B^2)^{1/2}$ becomes larger around the center, compared with the case of the related art or the first embodiment.

The phase-adjusted clock Clko output from the phase controlling circuit 30 is a clock signal having a shape close to a sinusoidal wave, and needs to be amplified by an amplifier so as to be transformed into a rectangular clock signal having the HIGH and LOW digital values. If the amplitude $(A^2+B^2)^{1/2}$ of the phase-adjusted clock Clko is too small, a problem may arise in that the amplitude cannot provide sufficient amplification. The provision of sufficient amplitude by use of the above-described configuration of the second embodiment can avoid the problem of insufficient amplification by the amplifier.

In order to ensure a constant phase change and constant amplitude, A=cons(m/n) and B=sin(m/n) (the amplitude being assumed to be 1 for the sake of simplicity) may be sufficient if the clock signals are perfectly sinusoidal. With such provision, two phasors having the amplitude A and the amplitude B perpendicular to each other in the complex plane are added to form a single phasor that draws a circle at a constant angular change. This thus achieves a constant phase change and constant amplitude.

The amplitude A of the clock signal Clka and the amplitude B of the clock signal Clkb shown in FIG. 8 are close to the shape of cos(m/n) and sin(m/n), respectively. Accordingly, the use of amplitude settings (current amount settings) as shown in FIG. 8 makes it possible to achieve a substantially constant phase change and substantially constant amplitude.

Further, the present invention is not limited to these embodiments, but various variations and modifications may be made without departing from the scope of the present invention.

What is claimed is:

1. A circuit for controlling phase, comprising:
   a first node operative to provide a flow of a current responsive to a first clock signal;
   a first plurality of switch circuits coupled to said first node;
   a first plurality of current supply sources coupled to said first plurality of switch circuits, respectively;
   a second node operative to provide a flow of a current responsive to a second clock signal;
   second plurality of switch circuits coupled to said second node; and
   a second plurality of current supply sources coupled to said second plurality of switch circuits, respectively,
   wherein said first node and said second node are coupled to each other such as to combine the first clock signal and the second clock signal, at least one of said first plurality of current supply sources having a current supply amount different from a current supply amount of another one of said first plurality of current supply sources, and at least one of said second plurality of current supply sources having a current supply amount different from a current supply amount of another one of said second plurality of current supply; and
   wherein said first plurality of current supply sources and said second plurality of current supply sources are configured to have respective current supply amounts such that a third clock signal made by combining the first clock signal and the second clock signal has a phase change responding to a change in opening and closing of said first plurality of switch circuits and said second plurality of switch circuits, said third clock signal having a substantially constant amplitude despite said phase change.

2. The circuit as claimed in claim 1, wherein closing and opening of said first plurality of switches and said second plurality of switches are controlled so as to control an amount of the current responsive to the first clock signal and an amount of the current responsive to the second clock signal.

3. The circuit as claimed in claim 1 wherein said first plurality of current supply sources have respective current supply amounts each different from one another, and said second plurality of current supply sources have respective current supply amounts each different from one another.

4. The circuit as claimed in claim 1, wherein said phase change is substantially constant.

5. The circuit as claimed in claim 1, wherein said first plurality of current supply sources and said second plurality of current supply sources are each MOS transistors.

6. The circuit as claimed in claim 5, wherein the MOS transistors of said first plurality of current supply sources have gate widths, at least one of which is different from another, and the MOS transistors of said second plurality of current supply sources have gate widths, at least one of which is different from another.

7. The circuit as claimed in claim 5, wherein the MOS transistors of said first plurality of current supply sources have gate widths, each of which is different from one another, and the MOS transistors of said second plurality of current supply sources have gate widths, each of which is different from one another.

8. The circuit as claimed in claim 1, wherein said first plurality of switch circuits and said second plurality of switch circuits are each MOS transistors.

9. A circuit for controlling phase, in which a plurality of configurations are provided, and each of the configuration controls a current amount of a clock signal by using a plurality of switch circuits to control coupling and uncoupling between a predetermined node and a plurality of current supply sources so as to change a current amount flowing through the predetermined node, said configurations being used to control current amounts of clock signals having different phases so as to generate an output clock signal having a desired phase made by combining the clock signals, characterized in that said current supply sources are configured to have respective current supply amounts, at least one of which is different from another, such that the output clock signal has a phase change responding to a change in opening and closing of said plurality of switch circuits, said output clock signal having a substantially constant amplitude despite said phase change.

* * * * *